United States Patent
Bell et al.

(10) Patent No.: US 7,270,176 B2
(45) Date of Patent: Sep. 18, 2007

(54) SYSTEM AND APPARATUS FOR FIXING A SUBSTRATE WITH A HEAT TRANSFERRING DEVICE

(75) Inventors: Michael Ray Bell, Dallas, TX (US); David Stevens, Sunnyvale, TX (US); Anthony Schneeman, Forney, TX (US); William Lonzo Woods, Jr., Kaufman, TX (US); Yi-Teh Shih, Richardson, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 104 days.

(21) Appl. No.: 11/098,715

(22) Filed: Apr. 4, 2005

(65) Prior Publication Data

US 2006/0219385 A1 Oct. 5, 2006

(51) Int. Cl.
F28F 7/00 (2006.01)

(52) U.S. Cl. .................................. 165/80.2; 165/185

(58) Field of Classification Search ................ 248/678, 248/676, 346.01; 165/80.2, 185; 361/690, 361/697, 701–703
See application file for complete search history.

(56) References Cited

U.S. PATENT DOCUMENTS

| | | | | |
|---|---|---|---|---|
| 3,688,635 A | * | 9/1972 | Fegen | 174/138 A |
| 4,760,495 A | * | 7/1988 | Till | 361/804 |
| 5,305,185 A | * | 4/1994 | Samarov et al. | 361/704 |
| 5,586,005 A | * | 12/1996 | Cipolla et al. | 361/719 |
| 6,046,905 A | * | 4/2000 | Nelson et al. | 361/704 |
| 6,209,623 B1 | * | 4/2001 | Tantoush | 165/80.3 |

* cited by examiner

*Primary Examiner*—Teresa J. Walberg
(74) *Attorney, Agent, or Firm*—Law Office of Donald D. Mondul

(57) ABSTRACT

A system for fixing a substrate with a heat transferring device in an assembled orientation; the system comprising: a substantially rod-shaped positioning member having a length generally symmetrically oriented about an axis and a generally constant lateral expanse substantially perpendicular with said axis substantially along said length; said positioning member interferingly fitting within at least one of a first aperture in said substrate and a second aperture in said heat transferring device to maintain a predetermined separation between said substrate and said heat transferring device in said assembled orientation.

20 Claims, 3 Drawing Sheets

SYSTEM AND APPARATUS FOR FIXING A SUBSTRATE WITH A HEAT TRANSFERRING DEVICE

BACKGROUND OF THE INVENTION

The present invention is directed to affixing substrates to heat transferring devices. The present invention is especially directed to affixing substrates to heat transferring devices when the affixed substrates have power dissipating (i.e., heat generating) components. The present invention affixes circuit-bearing substrates to heat transferring devices in a structure permitting occupation of a larger portion of the substrate surface facing the heat transferring device in an assembled orientation than has heretofore been feasible using prior art circuit-bearing substrates.

In today's market manufacturers are pressured to offer power conversion products handling increased power in a smaller package size. One result of these market pressures is that board space on surfaces of circuit-bearing substrates is at a premium. Increased power requires greater heat transfer from products in order to maintain reliability and product life.

A technique for transferring heat from a product is to attach a heat transfer device, such as a heat sink, in proximity with heat generating circuitry to aid in transferring heat away from the heat source. Spacing between the heat transferring device and adjacent circuitry is an important consideration. A product designer provides spacing to establish a small separation to facilitate heat transfer away from the circuitry. However, the spacing must not be so close as to provide an arc path or conduction path from the circuitry. Prior art heat transfer device affixing systems and apparatuses have relied upon a spacing structure such as a stepped section or shoulder in a support post to abut a face of a circuit-bearing substrate facing the mounted heat transferring device when assembled. Often a grounding pad structure is provided on the face of the substrate to contact the shoulder and thereby electrically grounding the heat transferring device. A disadvantage of such a structure is that the shoulder and the grounding pad occupy valuable substrate space that could otherwise be employed for implementing circuitry.

There is a need for a system and apparatus for fixing a substrate with a heat transferring device that does not occupy surface area of the substrate.

SUMMARY OF THE INVENTION

A system for fixing a substrate with a heat transferring device in an assembled orientation includes: a substantially rod-shaped positioning member having a length generally symmetrically oriented about an axis and a generally constant lateral expanse substantially perpendicular with the axis substantially along the length. The positioning member interferingly fits within at least one of a first aperture in the substrate and a second aperture in the heat transferring device to maintain a predetermined separation between the substrate and the heat transferring device in the assembled orientation.

It is, therefore, an object of the present invention to provide a system and apparatus for fixing a substrate with a heat transferring device that does not occupy surface area of the substrate.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
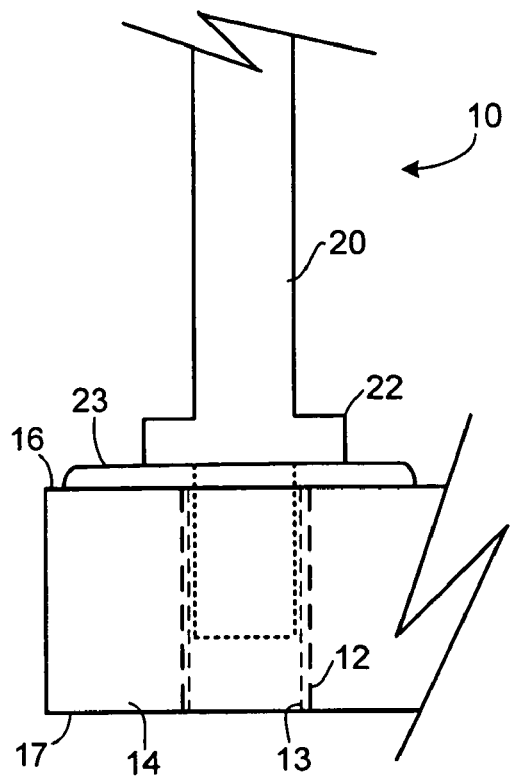
FIG. 1 is an elevation view of a prior art support apparatus for a heat transferring device.

FIG. 1 is an elevation view of a prior art support apparatus for a heat transferring device. In FIG. 1, a post 10 is installed in an aperture 12 of a substrate 14. Post 10 includes a shaft 20 inserted within aperture 12. A shoulder 22 is integrally formed in shaft 10. Shoulder 22 limits depth of insertion of shaft 20 into aperture 12. Substrate 14 has an upper surface 16 upon which circuit traces and other items of circuitry (not shown in detail in FIG. 1) may be arrayed and attached. Circuitry may be attached to a grounding pad 23 situated between shoulder 22 and upper surface 16. Aperture 12 is commonly configured as a through-hole traversing substrate 14 from upper surface 16 to a lower surface 17. Aperture 12 may be plated to present a material layer 13 within aperture 12. Material layer 13 is commonly embodied in a solder layer. Post 10 may be secured to substrate 14 using a press-fit relationship within aperture 12 between post 10 and substrate 14, or by soldering post 10 to metal layer 13 within aperture 12. Except for a grounding pad such as grounding pad 23, the area of upper surface 16 that is covered by shoulder 22 is unavailable for circuitry.

The present invention is a system and apparatus that reduces overall size of attachment structure affixing a heat transferring device such as a heat sink with a substrate. The present invention is especially advantageously employed with a circuit-bearing substrate. A heat transferring device used with the present invention may be a flat plate structure, a finned structure or another heat transferring device or heat sink structure. The present invention will not interfere with attachment of an additional heat transferring device to a first heat transferring device, such as attaching a finned heat sink to a flat plate heat sink that is affixed with a substrate. The present invention may also be employed in structures where a module's heat sink is affixed with a larger heat sink such as may be used for conduction cooling applications in a wireless base station system or another environment.

The present invention is a system and apparatus for affixing a heat transferring device such as a heat sink to a printed wiring board or similar circuit-bearing substrate. The preferred embodiment of the invention is a pin generally symmetrical with respect to a longitudinal axis, having a generally constant lateral dimension substantially perpendicular with the longitudinal axis and having no shoulder structure for controlling spatial relationship between the heat transferring device and the substrate. An aperture with no surrounding conductive land or pattern on the outer surface of the substrate receives the pin. The aperture preferably contains electrodeposited copper from a plating operation carried out on the upper surface or carried out during manufacture of various layers of a multi-layer substrate. The pin and the aperture are configured to establish a press-fit relationship when assembled. A fixture is preferably used during assembly of the pin and the substrate to establish the desired separation or spatial relation between substrate and heat transferring device. Preferably the press-fit relationship between substrate and pin and a press-fit relationship between the pin and the heat sink maintain the spatial relationship that is established by the fixture during assembly.

The press-fit relationship between the pin and the substrate is preferably enhanced by the respective structures of the pin and the substrate. The pin is preferably substantially rod-shaped stand-off member generally symmetrically oriented about a longitudinal axis with a generally constant lateral expanse substantially perpendicular with the longitudinal axis along the length of the stand-off member. The pin preferably has a first engagement length configured for interference fitting within an aperture in the substrate. The mutual configurations of the first engagement length and the substrate aperture may include, by way of example and not by way of limitation, a polygonal rod with a round aperture, a polygonal aperture with a round pin, ridges longitudinally or laterally oriented on the pin or in the aperture or both, serrations or knurled areas arrayed on the pin or in the aperture or both, or other interference structures or combinations of interference structures.

An expanded end structure may be provided for the pin at its end distal from the substrate when assembled with the substrate. The expanded end structure may serve to provide added resistance to separation of the heat transferring device from the substrate after assembly. A preferred embodiment of such an expanded end structure is a nail head structure. Other structures may also suffice, such as a ball structure, a cross-piece T-shaped structure or another structure providing an expanded diametral dimension to the pin on a side of the heat transferring device away from the substrate with which the heat transferring device is assembled. The heat transferring device may provide a countersunk aperture for the expanded end structure if desired to present a flush profile for the side of the heat transferring device away from the substrate when assembly is complete.

Figure 2:
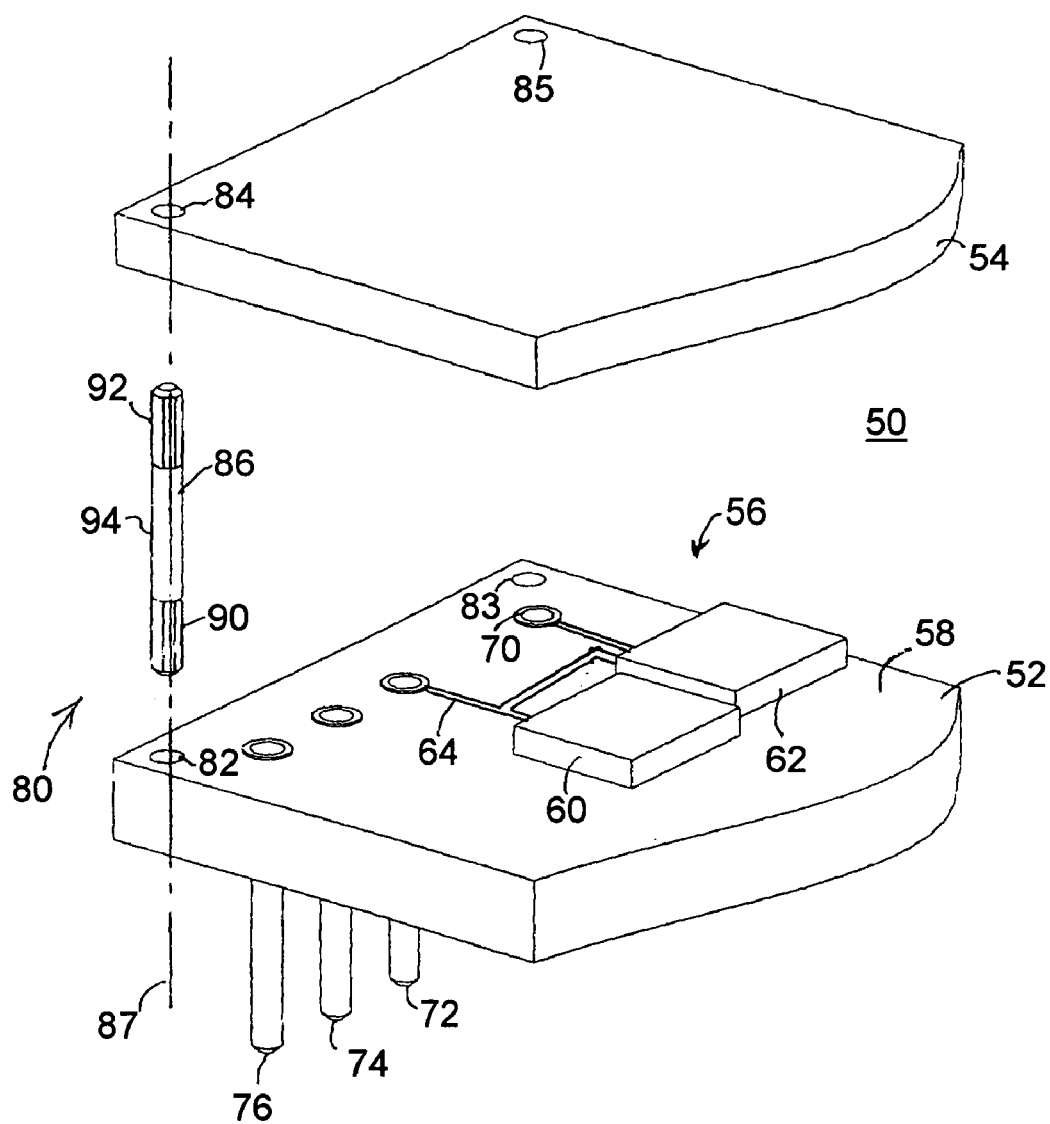
FIG. 2 is an exploded diagram of the system and apparatus of the present invention.

FIG. 2 is an exploded diagram of the system and apparatus of the present invention. In FIG. 2, a circuit assembly 50 includes a substrate 52 and a heat transferring device embodied in a flat plate heat sink 54. Substrate 52 bears circuitry 56 on an upper surface 58. Circuitry 56 representatively includes components 60, 62 connected by circuit paths or traces 64. Input-output (I/O) pins 70, 72 provide electrical connection between circuit components 60, 62 and outside loci (not shown in FIG. 2). I/O Pins 74, 76 provide electrical connection between other circuit components (not shown in FIG. 2) and outside loci. Substrate 52 and heat sink 54 are affixed with each other using an affixing system 80. Affixing system 80 includes an aperture 82 in substrate 52, an aperture 84 in heat sink 54 and a connecting pin 86. Apertures 82, 84 and pin 86 are substantially co-axial with respect to an axis 87 when circuit assembly 50 is in an assembled orientation.

Pin 86 is generally rod-shaped having a first engagement length 90, a second engagement length 92 and an intermediate length 94. First engagement length 90 is configured for insertion to a first insertion depth within aperture 82 for effecting an interference fit with aperture 82. Second engagement length 92 is configured for insertion to a second insertion depth within aperture 84 for effecting an interference fit with aperture 84. The first insertion depth within aperture 82, the second insertion depth within aperture 84 and intermediate length 94 cooperate to maintain a predetermined distance between substrate 54 and heat sink 56 in an assembled orientation.

Affixing system 80 typically includes additional pins and apertures, represented by aperture 83 in substrate 52 and aperture 85 in heat sink 54. Details of those additional pins and apertures are not included here in order to keep explanation of the present invention uncluttered and avoid repetitious prolixity.

An assembly fixture (not shown in FIG. 2) may be employed in assembling circuit assembly 50. In such an arrangement, the assembly fixture establishes the predetermined distance between substrate 52 and heat sink 54 while effecting assembly and the predetermined distance is maintained by cooperation of the first insertion depth within aperture 82, the second insertion depth within aperture 84 and intermediate length 94.

Figure 3:
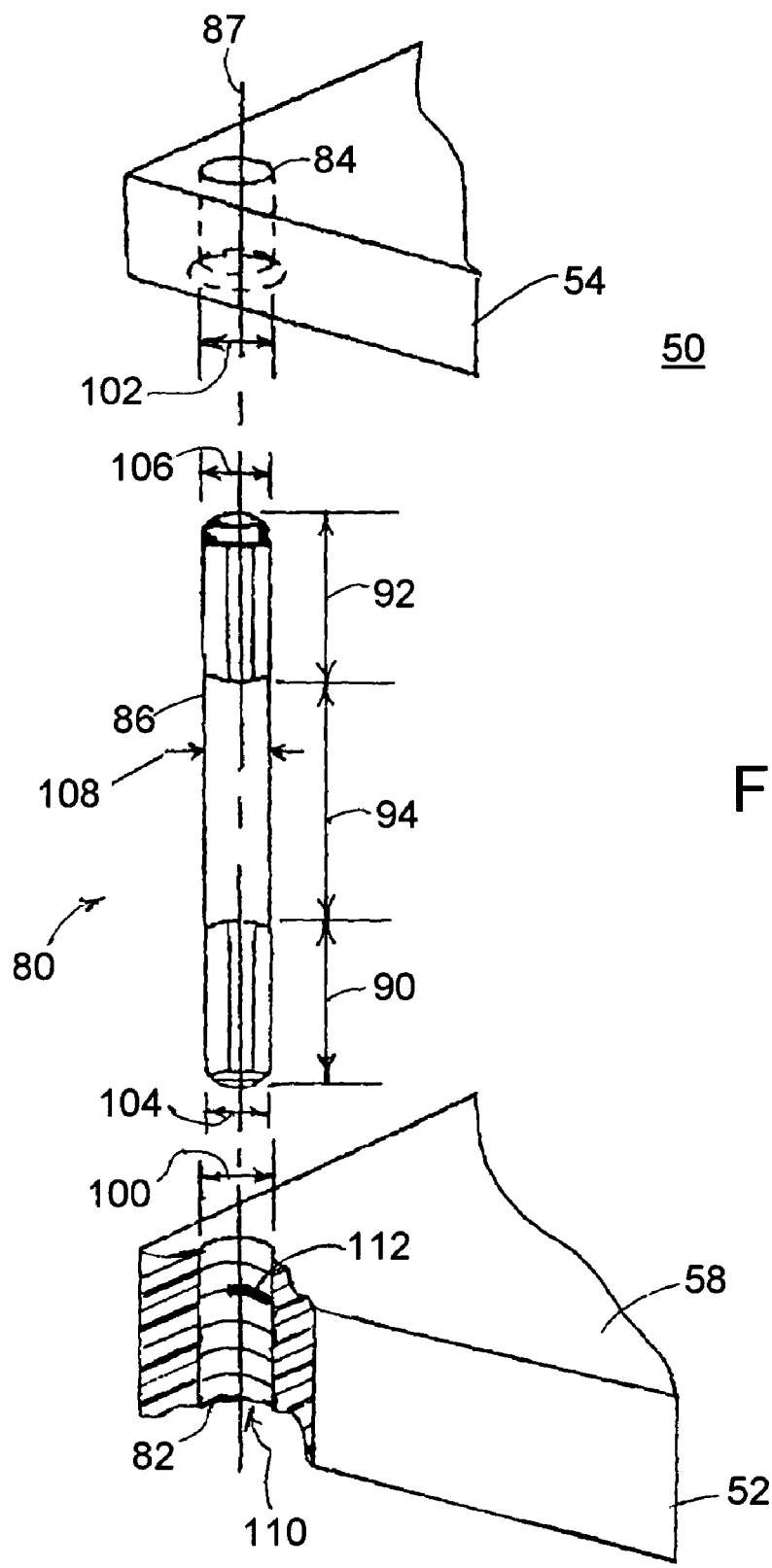
FIG. 3 is a diagram of detail of the apparatus of the present invention as it is grounded with a substrate.

FIG. 3 is a diagram of detail of the apparatus of the present invention as it is grounded with a substrate. In FIG. 3, like elements to those elements identified in FIG. 2 will be referred to using like reference numerals. In FIG. 3, circuit assembly 50 includes substrate 52 heat sink 54. Substrate 52 bears circuitry 56 on an upper surface 58. Substrate 52 and heat sink 54 are affixed with each other using affixing system 80. Affixing system 80 includes aperture 82 in substrate 52, aperture 84 in heat sink 54 and connecting pin 86. Apertures 82, 84 and pin 86 are substantially co-axial with respect to an axis 87 when circuit assembly 50 is in an assembled orientation.

Pin 86 is generally rod-shaped having a first engagement length 90, a second engagement length 92 and an intermediate length 94. First engagement length 90 is configured for insertion to a first insertion depth within aperture 82 for effecting an interference fit with aperture 82. Second engagement length 92 is configured for insertion to a second insertion depth within aperture 84 for effecting an interference fit with aperture 84. The first insertion depth within aperture 82, the second insertion depth within aperture 84 and intermediate length 94 cooperate to maintain a predetermined distance between substrate 54 and heat sink 56 in an assembled orientation.

Aperture 82 has a first trans-axial minimum dimension 100 substantially perpendicular with axis 87. Aperture 84 has a second trans-axial minimum dimension 102 substantially perpendicular with axis 87. First engagement length 90 has a first trans-axial engagement dimension 104 substantially perpendicular with axis 87. Second engagement length 92 has a second trans-axial engagement dimension 106 substantially perpendicular with axis 87. Intermediate length 94 has a trans-axial dimension 108. Intermediate trans-axial dimension 108 is generally similar with trans-axial dimension 104.

The press-fit relationship between connecting pin 86 and substrate 52 is preferably enhanced by the respective structures of connecting pin 86 and substrate 52. Connecting pin 86 is preferably substantially rod-shaped generally symmetrically oriented about a longitudinal axis 87 with a generally constant lateral expanse substantially perpendicular with longitudinal axis 87 along the length of connecting pin 86. First engagement length 90 is preferably configured for interference fitting within aperture 82 in substrate 52. The mutual configurations of first engagement length 90 and aperture 82 may include, by way of example and not by way of limitation, a polygonal rod 86 with a round aperture 82, a polygonal aperture 82 with a round pin 86, ridges longitudinally or laterally oriented on connecting pin 86 or in aperture 82 or both connecting pin 86 and aperture 82, serrations or knurled areas arrayed on connecting pin 86 or in aperture 82 or both connecting pin 86 and aperture 82, or other interference structures or combinations of interference structures.

In the preferred embodiment of circuit assembly 50, substrate 52 is a multi-layer substrate having a plurality of layers 110. One or more selected layers 110 may have a grounding connecting edge structure 112 facing interior to aperture 82 so that insertion of connecting pin 86 within aperture 82 effects grounding of connecting pin 86. This configuration—a multi-layered substrate 52 with grounding connection edge structure 112—utilizes an important advantage of the present invention: the opening of areas surrounding junction of connection pin 86 with substrate 52 about aperture 82 for circuitry population.

Figure 4:
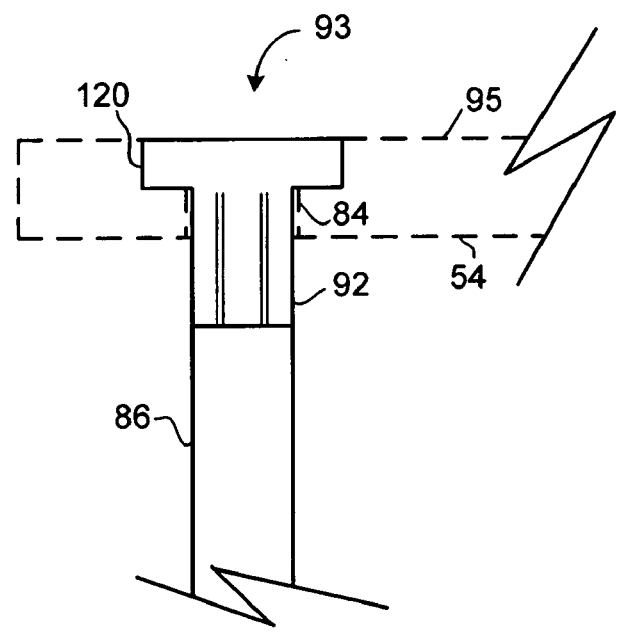
FIG. 4 is an elevation view of detail of an alternate embodiment of the apparatus of the present invention.

FIG. 4 is an elevation view of detail of an alternate embodiment of the apparatus of the present invention. In FIG. 4, like elements to those elements identified in FIGS. 2-3 will be referred to using like reference numerals. In FIG. 4, connecting pin 86 is engaged within aperture 84 in heat sink 54 within second engagement length 92. Integrally formed in second engagement length 92 is an expanded end structure 120 at the end 93 of connecting pin 86 distal from substrate 53 when circuit assembly 50 is assembled (FIGS. 2-3). Expanded end structure 120 serves to provide added resistance to separation of the heat sink 54 from substrate 52 after circuit assembly 50 is assembled. A preferred embodiment of expanded end structure 120 is a nail head structure, as illustrated in FIG. 4. Other structures may also suffice, such as a ball structure, a cross-piece T-shaped structure or another structure providing an expanded diametral dimension to the pin on top side 95 of the heat sink 54. Aperture 84 may be countersunk, as illustrated in FIG. 4, to present a flush profile for top side 95 when circuit assembly 50 is assembled.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. A system for fixing a substrate with a heat transferring device in an assembled orientation; the system comprising: a substantially rod-shaped positioning member having a length generally symmetrically oriented about an axis and a generally constant lateral expanse substantially perpendicular with said axis substantially along said length; said positioning member generally transaxially interferingly fitting within at least one of a first aperture in said substrate and a second aperture in said heat transferring device to maintain a predetermined separation between said substrate and said heat transferring device in said assembled orientation.

2. A system for fixing a substrate with a heat transferring device in an assembled orientation as recited in claim 1 wherein said positioning member further comprises a first interference structure integrally formed at a first end for effecting said interferingly fitting with said substrate.

3. A system for fixing a substrate with a heat transferring device in an assembled orientation as recited in claim 1 wherein said positioning member further comprises a second interference structure integrally formed at a second end for effecting said interferingly fitting with said heat transferring device.

4. A system for fixing a substrate with a heat transferring device in an assembled orientation as recited in claim 1 wherein said positioning member further comprises a nail head termination structure at a second end for resisting separating said substrate from said heat transferring device; said heat transferring device being situated between said nail head termination structure and said substrate in said assembled orientation.

5. A system for fixing a substrate with a heat transferring device in an assembled orientation as recited in claim 2 wherein said positioning member further comprises a second interference structure integrally formed at a second end for effecting said interferingly fitting with said heat transferring device.

6. A system for fixing a substrate with a heat transferring device in an assembled orientation as recited in claim 2 wherein said positioning member further comprises a nail head termination structure at a second end for resisting separating said substrate from said heat transferring device; said heat transferring device being situated between said nail head termination structure and said substrate in said assembled orientation.

7. A system for fixing a substrate with a heat transferring device in an assembled orientation as recited in claim 3 wherein said positioning member further comprises a nail head termination structure at a second end for resisting separating said substrate from said heat transferring device; said heat transferring device being situated between said nail head termination structure and said substrate in said assembled orientation.

8. A system for fixing a substrate with a heat transferring device in an assembled orientation; the system comprising: at least one substantially rigid positioning member having a length generally symmetrically oriented about an axis and a generally constant lateral expanse substantially perpendicular with said axis substantially along said length; said positioning member being received within at least one first aperture in said substrate and received within at least one second aperture in said heat transferring device; said at least one positioning member and said at least one first aperture being configured to cooperatively establish a generally transaxial interference fitting relation; said interference fitting relation maintaining a predetermined depth of reception of each respective positioning member of said at least one positioning member within each respective first aperture of said at least one first aperture.

9. A system for fixing a substrate with a heat transferring device in an assembled orientation as recited in claim 8 wherein said positioning member further comprises a first interference structure integrally formed at a first end for effecting said interferingly fitting with said substrate.

10. A system for fixing a substrate with a heat transferring device in an assembled orientation as recited in claim 8 wherein said positioning member further comprises a second interference structure integrally formed at a second end for effecting said interferingly fining with said heat transferring device.

11. A system for fixing a substrate with a heat transferring device in an assembled orientation as recited in claim 8 wherein said positioning member further comprises a nail head termination structure at a second end for resisting separating said substrate from said heat transferring device; said heat transferring device being situated between said nail head termination structure and said substrate in said assembled orientation.

12. A system for fixing a substrate with a heat transferring device in an assembled orientation as recited in claim 9 wherein said positioning member further comprises a second interference structure integrally formed at a second end for effecting said interferingly fitting with said heat transferring device.

13. A system for fixing a substrate with a heat transferring device in an assembled orientation as recited in claim 9 wherein said positioning member further comprises a nail head termination structure at a second end for resisting separating said substrate from said heat transferring device; said heat transferring device being situated between said nail head termination structure and said substrate in said assembled orientation.

14. A system for fixing a substrate with a heat transferring device in an assembled orientation as recited in claim 10 wherein said positioning member further comprises a nail head termination structure at a second end for resisting separating said substrate from said heat transferring device; said heat transferring device being situated between said nail head termination structure and said substrate in said assembled orientation.

15. An apparatus for fixing a substrate a predetermined distance from a heat transferring device in an assembled orientation; said substrate having a first aperture with a first internal structure substantially oriented about a first axis; said first internal structure having a first transaxial minimum dimension substantially perpendicular with said first axis; said heat transferring device having a second aperture with a second internal structure substantially oriented about a second axis; said second internal structure having a second transaxial minimum dimension substantially perpendicular with said second axis; the apparatus comprising: a generally rod-shaped stand-off member generally symmetrically oriented about a longitudinal axis; said stand-off member having a first engagement length having a first trans-axial engagement dimension substantially perpendicular with said longitudinal axis; said first trans-axial engagement dimension cooperating with said first trans-axial minimum dimension to effect a first interference fit to establish a first depth of insertion of said stand-off member within said first aperture; said stand-off member having a second engagement length having a second trans-axial engagement dimension substantially perpendicular with said longitudinal; said second trans-axial engagement dimension cooperating with said second trans-axial minimum dimension to effect a second interference fit to establish a second depth of insertion of said stand-off member within said second aperture; said stand-off member having an intermediate length between said first engagement length and said second engagement length; said intermediate length having an intermediate transaxial dimension substantially perpendicular with said longitudinal axis; said intermediate transaxial dimension being generally equal with said first trans-axial engagement dimension; said first depth of insertion and said second depth of insertion cooperating with said intermediate length to establish said predetermined distance in said assembled orientation.

16. An apparatus for fixing a substrate a predetermined distance from a heat transferring device in an assembled orientation as recited in claim 15 wherein said first engagement length includes an integrally formed first interference structure for effecting said first interference fit.

17. An apparatus for fixing a substrate a predetermined distance from a heat transferring device in an assembled orientation as recited in claim 15 wherein said second engagement length includes an integrally formed second interference structure for effecting said second interference fit.

18. An apparatus for fixing a substrate a predetermined distance from a heat transferring device in an assembled orientation as recited in claim 15 wherein said second engagement length terminates in a nail head structure for resisting separating said substrate from said heat transferring device; said heat transferring device being situated between said nail head structure and said substrate in said assembled orientation.

19. An apparatus for fixing a substrate a predetermined distance from a heat transferring device in an assembled orientation as recited in claim 16 wherein said second engagement length includes an integrally formed second interference structure for effecting said second interference fit.

20. An apparatus for fixing a substrate a predetermined distance from a heat transferring device in an assembled orientation as recited in claim 16 wherein said second engagement length terminates in a nail head structure for resisting separating said substrate from said heat transferring device; said heat transferring device being situated between said nail head structure and said substrate in said assembled orientation.

* * * * *